US010962569B2

(12) United States Patent
Kaida et al.

(10) Patent No.: US 10,962,569 B2
(45) Date of Patent: Mar. 30, 2021

(54) PROBE, INSPECTION JIG, INSPECTION DEVICE, AND METHOD OF MANUFACTURING PROBE

(71) Applicants: Nidec-Read Corporation, Kyoto (JP); SV Probe Technology Taiwan Co., Ltd., Hsinchu County (TW)

(72) Inventors: Michio Kaida, Kyoto (JP); Huei Che Yu, Hsinchu County (TW)

(73) Assignees: Nidec-Read Corporation, Kyoto (JP); SV Probe Technology Taiwan Co., Ltd., Hsinchu County (TW)

( * ) Notice: Subject to any disclaimer, the term of this patent is extended or adjusted under 35 U.S.C. 154(b) by 20 days.

(21) Appl. No.: 16/413,609

(22) Filed: May 16, 2019

(65) Prior Publication Data

US 2019/0353684 A1 Nov. 21, 2019

(30) Foreign Application Priority Data

May 16, 2018 (JP) .............................. JP2018-094974

(51) Int. Cl.
*G01R 1/073* (2006.01)
*G01R 31/28* (2006.01)
*G01R 1/067* (2006.01)

(52) U.S. Cl.
CPC ...... *G01R 1/07357* (2013.01); *G01R 1/06711* (2013.01); *G01R 31/2887* (2013.01)

(58) Field of Classification Search
CPC ....................... G01R 1/07307; G01R 1/07342
See application file for complete search history.

(56) References Cited

U.S. PATENT DOCUMENTS 6,356,090 B2 * 3/2002 Deshayes ........... G01R 1/07342
324/756.03
2012/0042516 A1 * 2/2012 Takeya ............... G01R 1/07357
29/852

FOREIGN PATENT DOCUMENTS

JP 2001074779 3/2001

* cited by examiner

*Primary Examiner* — Tung X Nguyen
(74) *Attorney, Agent, or Firm* — JCIPRNET

(57) ABSTRACT

Provided are a probe that enables control of a bending direction and can be simply manufactured, an inspection jig using the probe, an inspection device, and a method of manufacturing the probe. A probe has a substantially bar-like shape extending linearly and includes: a tip end portion, a body portion continuous with the tip end portion Pa; and a base end portion continuous with the body portion. The body portion includes a first connection region having a thickness in a thickness direction perpendicular to an axial direction of the bar-like shape that gradually decreases away from the tip end portion, and a second connection region having a thickness that gradually decreases away from the base end portion. A dimension of the body portion in a width direction perpendicular to the thickness direction is larger than dimensions of the tip end portion and the base end portion.

20 Claims, 12 Drawing Sheets

PROBE, INSPECTION JIG, INSPECTION DEVICE, AND METHOD OF MANUFACTURING PROBE

CROSS REFERENCE TO RELATED APPLICATIONS

This application claims the priority benefit of Japanese Patent Application No. 2018-094974, filed on May 16, 2018. The entirety of the above-mentioned patent application is hereby incorporated by reference herein and made a part of this specification.

BACKGROUND

Technical Field

The disclosure relates to a probe, an inspection jig, an inspection device, and a method of manufacturing a probe that are used in inspection.

Description of Related Art

In the related art, inspection of an inspection target, such as a semiconductor chip or a substrate on which circuits, wiring, and the like are formed, has been performed by causing a plurality of needle-like probes to abut on the inspection target and applying electrical signals between the probes, or measuring voltages between the probes in order to inspect the inspection target. There is a concern that the probes may bend and contact with adjacent probes when such a plurality of probes are caused to abut on the inspection target.

Thus, a probe configured to include a needle tip portion, a needle intermediate portion that is continuous with the needle tip portion, and a needle rear portion that is continuous with the needle intermediate portion, in which each of the needle tip portion, the needle intermediate portion, and the needle rear portion has a plate-shaped region, and the plate-shaped regions of the needle tip portion and the needle rear portion in the width direction have an angle of about 90 degrees with respect to the plate-shaped region of the needle intermediate portion in the width direction when seen from the side of the needle tip end or the needle rear end, is known (see Patent Document 1 (Japanese Patent Laid-Open No. 2001-74779), for example).

Patent Document 1 discloses controlling a bending direction of a probe using the plate-shaped region of the needle intermediate portion by inserting the plate-shaped regions of the needle tip portion and the needle rear portion into slits, thereby defining orientations of the respective probes, enabling arrangement of the probes with a narrow pitch outside a virtual rectangle by arranging such a plurality of probes at the respective sides of the virtual rectangle and bending the probes toward the inside of the rectangle, and manufacturing such probes through press working or etching working using a metal thin wire.

However, etching working incurs greater working costs than press working. Meanwhile, in a case in which the probe disclosed in Patent Document 1 is worked through press working, it is necessary to perform pressing at least twice while changing the molds and the pressing direction, and it is not easy to manufacture the probe disclosed in Patent Document 1 since the pressing direction of the plate-shaped regions of the needle tip portion and the needle rear portion and the pressing direction of the plate-shaped region of the needle intermediate portion are different by 90 degrees.

The disclosure is to provide a probe that enables control of a bending direction and that can easily be manufactured, an inspection jig that uses the probe, an inspection device, and a method of manufacturing the probe.

SUMMARY

According to one aspect of one embodiment of the disclosure, a probe is provided to have a substantially bar-like shape that extends linearly. The probe includes one end portion, a body portion that is continuous with the one end portion; and an other end portion that continues from the body portion. The body portion includes a first connection region having a thickness in a thickness direction perpendicular to an axial direction of the bar-like shape that gradually decreases away from the one end portion, and a second connection region having a thickness that gradually decreases away from the other end portion. A dimension of the body portion in a width direction perpendicular to the thickness direction is larger than dimensions of the one end portion and the other end portion.

In addition, according to another aspect of the disclosure, an inspection jig is provided to include: the aforementioned probe; a first plate that has a first through-hole into which the probe is inserted formed therein; a second plate that has a second through-hole into which the probe is inserted formed therein; and a linking member that supports the first plate and the second plate with an interval therebetween. At least a part of the body portion is located in the first through-hole. The first through-hole includes a hole main body, which has an inner diameter smaller than a maximum dimension of a portion located in the first through-hole of the body portion in the width direction, and through which the one end portion is able to be inserted. A pair of guide grooves that are formed at positions that face one another in an inner wall of the hole main body such that the guide grooves extend in a penetrating direction of the first through-hole. At least a part of the body portion is located in the pair of guide grooves.

According to still another aspect of the disclosure, an inspection device is provided to allow inspection of an inspection target by causing the aforementioned probe to abut on the inspection target.

According to still another aspect of the disclosure, a method of manufacturing the probe above is provided and the method includes: using a first mold and a second mold that face one another in the thickness direction of the body portion and have protruding shapes corresponding to surface shapes recessed from both sides of the body portion; and press-working a bar-like member that is put between a first mold and a second mold.

DESCRIPTION OF THE EMBODIMENTS

Figure 1:
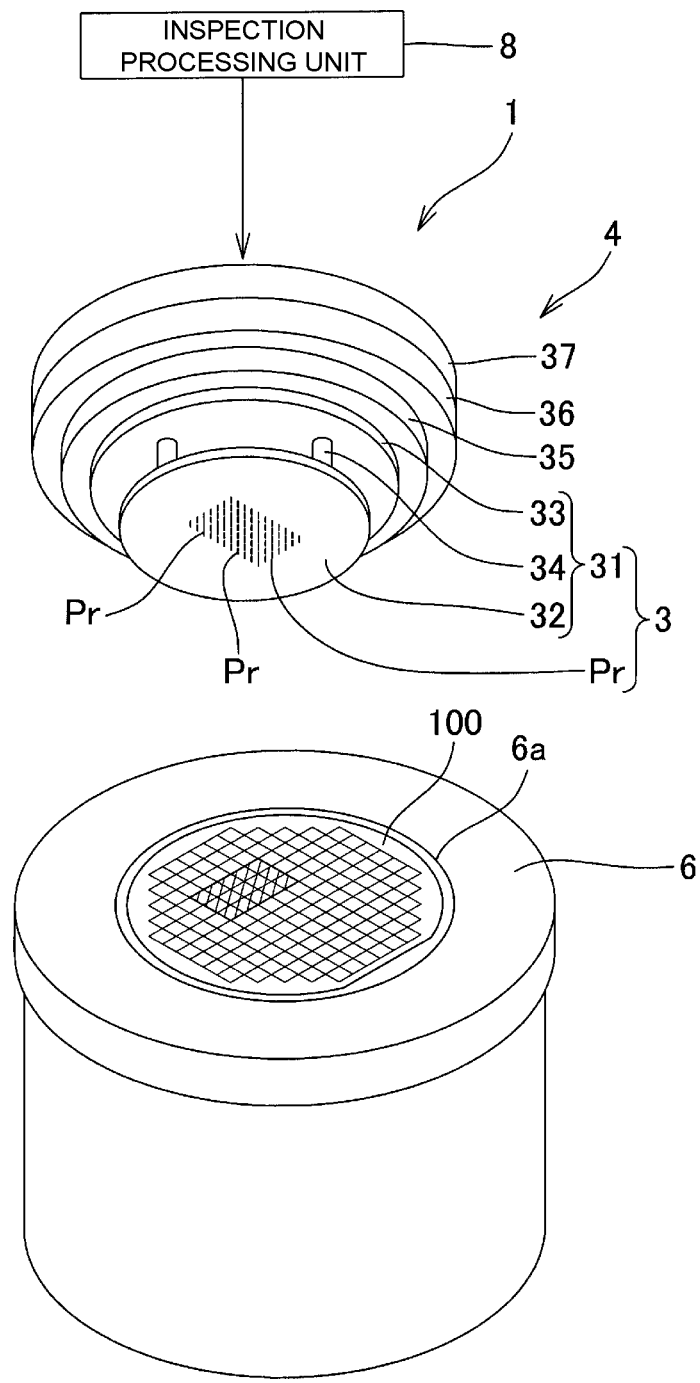
FIG. 1 is a conceptual diagram schematically illustrating a configuration of a semiconductor inspection device provided with a probe according to an embodiment of the disclosure.

Hereinafter, embodiments of the disclosure will be described with reference to drawings. Note that components with the same reference numerals in the respective drawings will be the same components and description thereof will be omitted. FIG. 1 is a conceptual diagram schematically illustrating a configuration of a semiconductor inspection device 1 provided with a probe according to an embodiment of the disclosure. The semiconductor inspection device 1 corresponds to an example of an inspection device. The semiconductor inspection device 1 illustrated in FIG. 1 is an inspection device for inspecting a circuit that is formed on a semiconductor wafer 100 that is an example of an inspection target.

In the semiconductor wafer 100, circuits corresponding to a plurality of semiconductor chips are formed, for example, on a semiconductor substrate of a silicon or the like. Note that the inspection target may be an electronic component such as a semiconductor chip, a chip size package (CSP), or a semiconductor element (integrated circuit (IC)) or another target on which electrical inspection is performed.

Also, the inspection device is not limited to a semiconductor inspection device and may be a substrate inspection device that inspects a substrate, for example. The substrate that is an inspection target may be, for example, a substrate such as a print wiring substrate, a glass epoxy substrate, a flexible substrate, a ceramic multilayered wiring substrate, a package substrate for a semiconductor package, an interposer substrate, or a film carrier, an electrode panel for a display such as a liquid crystal display, an electro-luminescence (EL) display, or a touch panel display, an electrode panel for a touch panel, or substrates of various kinds.

The semiconductor inspection device 1 illustrated in FIG. 1 includes an inspection portion 4, a sample platform 6, and an inspection processing unit 8. A placement portion 6a on which the semiconductor wafer 100 is placed is provided on an upper surface of the sample platform 6, and the sample platform 6 is configured to secure the semiconductor wafer 100 that is an inspection target at a predetermined position.

The placement portion 6a is adapted to be able to be lifted and lowered and is adapted such that the semiconductor wafer 100 accommodated in the sample platform 6 is caused to be lifted to an inspection position and the semiconductor wafer 100 after the inspection is stored in the sample platform 6, for example. Also, the placement portion 6a is adapted to be able to cause the semiconductor wafer 100 to rotate and orient an orientation flat to a predetermined direction, for example. Also, the semiconductor inspection device 1 includes a transport mechanism such as a robot arm, which is not illustrated in the drawing. By the transport mechanism, the semiconductor wafer 100 is placed on the placement portion 6a, and the inspected semiconductor wafer 100 is transported from the placement portion 6a.

The inspection portion 4 includes an inspection jig 3, a first pitch conversion block 35, a second pitch conversion block 36, and a connection plate 37. The inspection jig 3 is a jig for performing inspection by causing a plurality of probes Pr to contact with the semiconductor wafer 100, and for example, the inspection jig 3 is configured by a so-called probe card.

A plurality of chips is formed in the semiconductor wafer 100. A plurality of pads and inspection points such as bumps are formed in each of the chips. Corresponding to a partial region of the plurality of chips formed in the semiconductor wafer 100 (for example, the hatched region in FIG. 1; hereinafter, referred to as an inspection region), the inspection jig 3 holds a plurality of probes Pr such that the probes Pr correspond to the respective inspection points in the inspection region.

If the probes Pr have been caused to contact with the respective inspection points in the inspection region and the inspection in the inspection region is finished, the placement portion 6a lowers the semiconductor wafer 100, the sample platform 6 moves in parallel and causes the inspection region to move, the placement portion 6a causes the semiconductor wafer 100 to be lifted, and inspection is then performed by causing the probes Pr to contact with a new inspection region. In this manner, the entire semiconductor wafer 100 is inspected by performing the inspection while causing the inspection region to sequentially move.

In addition, FIG. 1 is an explanatory diagram schematically and conceptually illustrating an example of the configuration of the semiconductor inspection device 1 from the viewpoint of allowing easy understanding of the disclosure, and the number, the density, and the arrangement of the probes Pr, the shapes, and the ratio between the sizes of the inspection portion 4 and the sample platform 6, and the like are also illustrated in a simple and conceptual manner. For example, the inspection region is illustrated in an enlarged and emphasized manner as compared with a typical semiconductor inspection device in terms of easy understanding of the arrangement of the probes Pr, and the inspection region may be smaller or larger.

The connection plate 37 is configured such that the second pitch conversion block 36 can be detached therefrom and attached thereto. A plurality of electrodes that are connected to the second pitch conversion block 36 (not shown) is formed on the connection plate 37. The respective electrodes of the connection plate 37 are electrically connected to the inspection processing unit 8 with cables, a connection terminals, or the like (not shown), for example. The first pitch conversion block 35 and the second pitch conversion block 36 are pitch conversion members for converting intervals between the probes Pr into an electrode pitch on the connection plate 37.

The inspection jig 3 includes the plurality of probes Pr that have tip end portions Pa and base end portions Pb, which will be described later, and a support member 31 that holds the plurality of probes Pr such that the tip end portions Pa or the base end portions Pb thereof are oriented toward the semiconductor wafer 100.

An electrode 352, which is brought into contact with and electrically conductive to the base end portion Pb or the tip end portion Pa of each probe Pr, is provided at the first pitch conversion block 35 and will be described later. The inspection portion 4 includes a connection circuit that electrically connects the respective probes Pr of the inspection jig 3 to the inspection processing unit 8 via the connection plate 37, the second pitch conversion block 36 and the first pitch conversion block 35 and switches the connection, which is not illustrated in the drawing.

In this manner, the inspection processing unit 8 is adapted to be able to supply an inspection signal to an arbitrary probe Pr and detects a signal from an arbitrary probe Pr via the connection plate 37, the second pitch conversion block 36 and the first pitch conversion block 35. Details of the first pitch conversion block 35 and the second pitch conversion block 36 will be described later.

The probe Pr has a substantially bar-like shape as a whole. The support member 31 includes an inspection-side support body 32 (second plate) that is disposed to face the semiconductor wafer 100, an electrode-side support body 33 (first plate) that is disposed at a side opposite to the semiconductor wafer 100 side of the inspection-side support body 32, and a linking member 34 that holds the inspection-side support body 32 and the electrode-side support body 33 parallel to each other with a predetermined distance therebetween.

A plurality of through-holes for supporting the probes Pr is formed in the inspection-side support body 32 and the electrode-side support body 33. The respective through-holes are arranged to correspond to the positions of the inspection points set on a wiring pattern of the semiconductor wafer 100 that is an inspection target. In this manner, the tip end portions Pa of the probes Pr are adapted to be in contact with the inspection points of the semiconductor wafer 100. For example, the plurality of probes Pr may be arranged at the respective intersection points at which a plurality of first straight lines that are parallel to each other and a plurality of second straight lines that are parallel to each other intersect in a grid pattern. The inspection points are, for example, electrodes, wiring patterns, solider bumps, connection terminals, or the like.

The inspection jig 3 is adapted to be replaceable in accordance with the semiconductor wafer 100 that is an inspection target.

Figure 2:
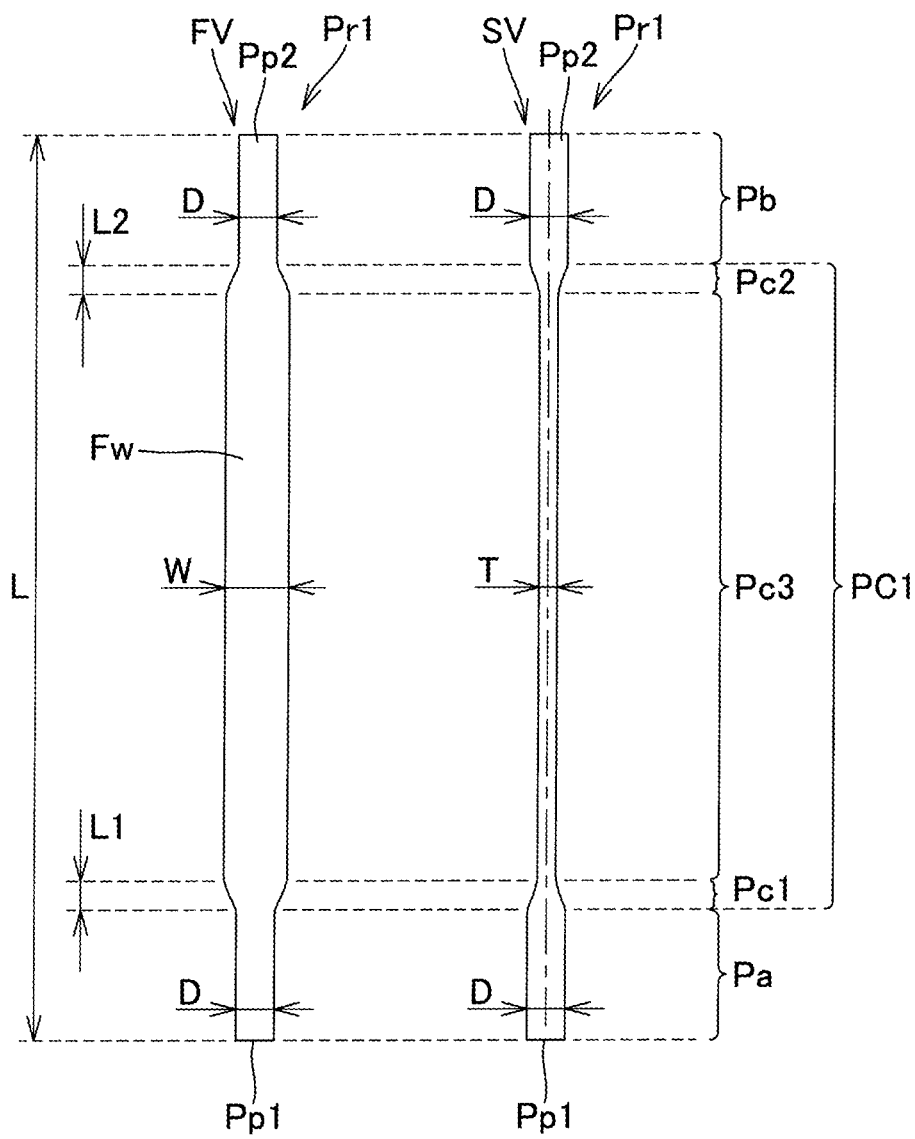
FIG. 2 is a front view and a side view of an example of the probe illustrated in FIG. 1.
Figure 3:
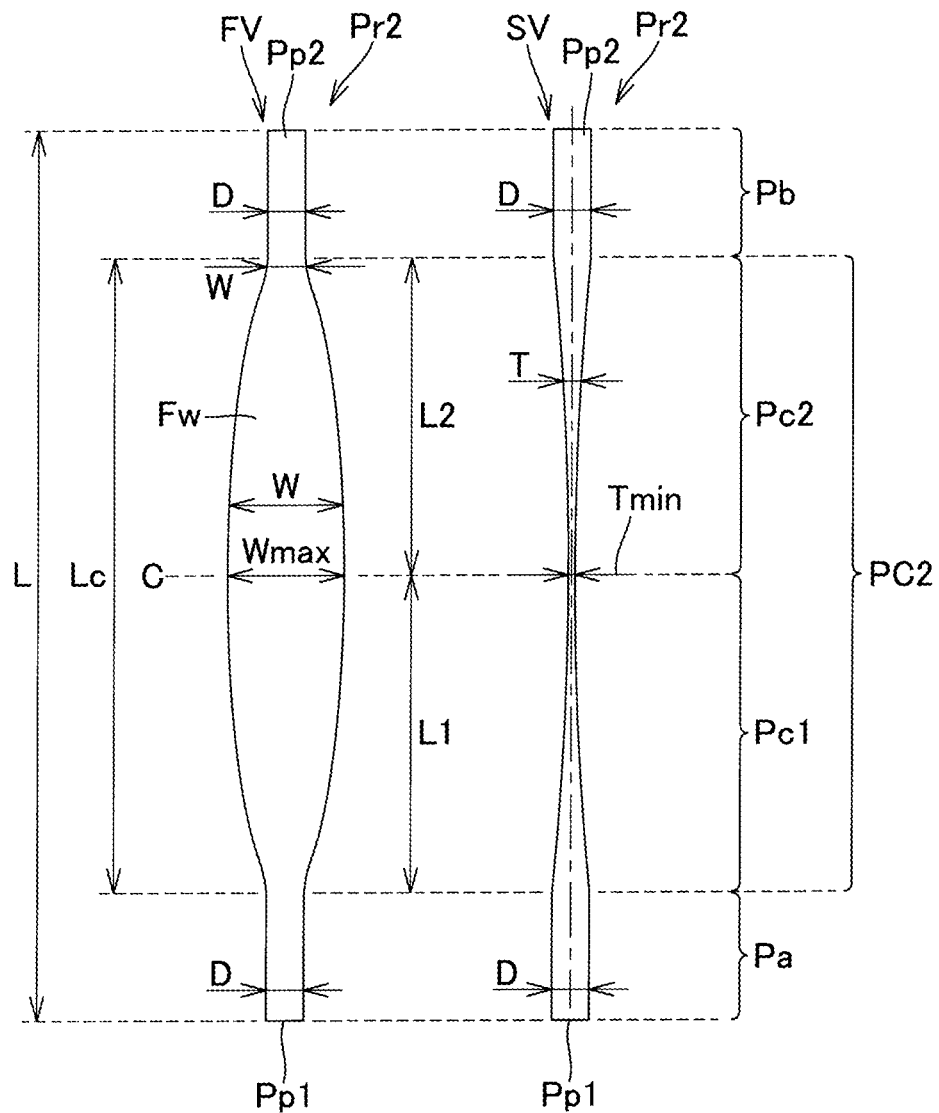
FIG. 3 is a front view and a side view of another example of the probe illustrated in FIG. 1.
Figure 4:
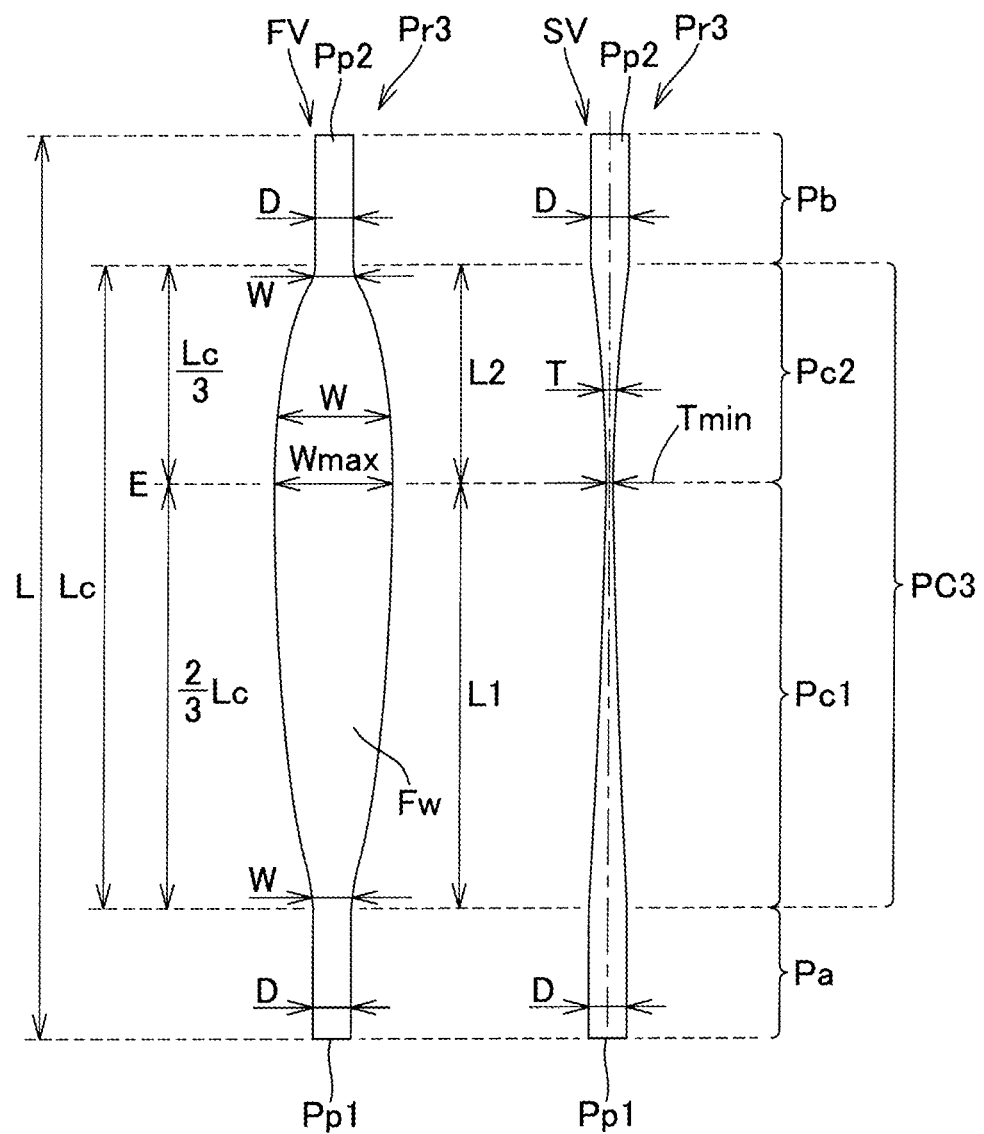
FIG. 4 is a front view and a side view of another example of the probe illustrated in FIG. 1.

FIG. 2 is a front view FV and a side view SV of an example of a probe Pr1 illustrated in FIG. 1. FIGS. 3 and 4 illustrate a front view FV and a side view SV of probes Pr2 and Pr3 that are other examples of the probe Pr illustrated in FIG. 1.

The probes Pr1, Pr2, and Pr3 illustrated in FIGS. 2, 3, and 4 have substantially bar-like shapes as a whole.

The probe Pr1 includes a tip end portion Pa with a substantially columnar shape, a body portion PC1 that is continuous with the tip end portion Pa, and a base end portion Pb that is continuous with the body portion PC1. The probe Pr2 includes a tip end portion Pa with a substantially columnar shape, a body portion PC2 that is continuous with the tip end portion Pa, and a base end portion Pb that is continuous with the body portion PC2. The probe Pr3 includes a tip end portion Pa with a substantially columnar shape, a body portion PC3 that is continuous with the tip end portion Pa, and a base end portion Pb that is continuous with the body portion PC3.

Hereinafter, the probes Pr1, Pr2, and Pr3 will be referred to as probes Pr, and the body portions PC1, PC2, and PC3 will be referred to as body portions PC.

The tip end portion Pa corresponds to an example of one end portion, and the base end portion Pb corresponds to an example of the other end portion. In addition, the tip end portion Pa may be regarded as the other end portion while the base end portion Pb may be regarded as one end portion. Each probe Pr may be used such that the tip end portion Pa is caused to contact with the inspection target and the base end portion Pb is caused to contact with the electrode 352 of the first pitch conversion block 35, or such that the tip end portion Pa is caused to contact with the electrode 352 of the first pitch conversion block 35 and the base end portion Pb is caused to contact with the inspection target.

The shape of an apex portion Pp1 at a tip end of the tip end portion Pa and an apex portion Pp2 at a tip end of the base end portion Pb may be flat, or may be a conical shape, a spherical surface shape, or a so-called crown shape provided with a plurality of protrusions, and can be various shapes. The shapes of the apex portions Pp1 and the apex portions Pp2 may be different from each other.

Each probe Pr may be used such that a portion obtained by working a round-bar wire material (wire) with a substantially columnar shape for example (a metal material with conductivity or the like) to be flat through press working or the like is regarded as the body portion PC, and portions on the both sides thereof, which are not press worked, are regarded as the tip end portion Pa and the base end portion Pb. Since the probe Pr include the body portion PC worked to be flat, it is possible to increase the surface area of the probe Pr. Therefore, a skin effect of a current further increases, and the probe Pr makes the current pass therethrough easily.

Each body portion PC includes a first connection region Pc1 in which the thickness T in the thickness direction perpendicular to the axial direction of each probe Pr gradually becomes thinner from both sides in the thickness direction as it gets away from the tip end portion Pa, and a second connection region Pc2 in which the thickness T gradually becomes thinner from the both sides in the thickness direction as it gets away from the base end portion Pb.

Also, the dimension in the width direction perpendicular to both the axial direction and the thickness direction, namely the width W of the body portion PC is larger than the diameter D of the tip end portion Pa and the base end portion Pb. Also, the width W of the first connection region Pc1 gradually increases toward the both sides in the width direction away from the tip end portion Pa. The width W of the second connection region Pc2 gradually increases toward the both sides in the width direction away from the base end portion Pb.

In this manner, the body portion PC has a shape that is recessed in the thickness direction by the thickness T gradually decreasing. Wide width surfaces Fw widen in the width direction are formed on both surfaces of the body portion PC in the thickness direction thereof. In this manner, since the body portion PC has a shape that is thinner in the thickness direction than in the width direction, the body portion PC is easier to be bent in the thickness direction than in the width direction. Also, since the width W of the body portion PC is set to be larger than the diameter D of the tip end portion Pa and the base end portion Pb, the bending direction is controlled and strength can be applied to the body portion PC due to the width W.

The length L of the probe Pr ranges from 3.0 to 8.0 mm, for example. The length of the tip end portion Pa and the base end portion Pb ranges from 0.8 to 1.6 mm or ranges from 0.3 to 0.6 mm, for example. In addition, the length of the tip end portion Pa and the length of the base end portion Pb may be different from each other. The diameter D of the tip end portion Pa and the base end portion Pb ranges from 30 to 100 µm or ranges from 50 to 65 µm, for example.

Next, features of the probe Pr1 will be described. The body portion PC1 of the probe Pr1 further includes a flat region Pc3 that extends such that the flat region Pc3 connects the first connection region Pc1 to the second connection region Pc2.

The flat region Pc3 of the probe Pr1 has a flattened band-like (ribbon) shape, and the width W and the thickness T thereof are substantially constant in the thickness direction. The thickness T of the flat region Pc3 is set to be about ½ of the diameter D, for example, or is set to be equal to or greater than ⅓ and equal to or less than ⅔ of the diameter D. For example, the thickness T is set to be about 30 µm.

The width W of the flat region Pc3 ranges from 40 to 120 µm or 60 to 90 µm, for example. In addition, the width W of the flat region Pc3 is not necessarily limited to a substantially constant width in the axial direction.

The length L1 of the first connection region Pc1 and the length L2 of the second connection region Pc2 range from 20 to 600 µm, for example. The lengths L1 and L2 may be different from each other.

The body portion PC1 is easy to be bent in a direction perpendicular to the wide width surfaces Fw (thickness T direction) and is hardly bent in the width W direction due to the flattened shape of the flat region Pc3. In this manner, the probe Pr1 is adapted such that the bending direction can be controlled.

Also, since the probe Pr1 includes the flat region Pc3 with the thickness T that is the thinnest in the entire probe Pr1 and is substantially constant, it is easy to apply strength that is equal to or greater than a predetermined strength to the probe Pr1 by appropriately setting the thickness T of the flat region Pc3.

Next, features of the probes Pr2 and Pr3 will be described. The probes Pr2 and Pr3 are different from the probe Pr1 in that the body portions PC2 and PC3 do not include the flat region Pc3. Each of the body portions PC2 and PC3 is configured in a manner that the first connection region Pc1 and the second connection region Pc2 are directly linked to each other, in which the thickness T of the first connection region Pc1 becomes thinner from the both sides in the thickness direction as it gets away from the tip end portion Pa, and the thickness T of the second connection region Pc2 becomes thinner from the both sides in the thickness direction as it gets away from the base end portion Pb.

The body portions PC2 and PC3 have shapes that are recessed in a curved manner in the thickness direction by the thickness T gradually getting thinner from the both sides in the axial direction toward the inner side.

The body portions PC2 and PC3 become the thinnest at the linking position (boundary) between the first connection region Pc1 and the second connection region Pc2. The thickness T at the thinnest portions of the body portions PC2 and PC3, namely the minimum value Tmin of the thickness T is set to be about ½ of the diameter D, for example, or set to be equal to or greater than ⅓ and equal to or less than ⅔ of the diameter D. For example, the thickness T can be set to be about 30 µm.

Also, the width W of the first connection region Pc1 gradually increases toward the both sides in the width direction away from the tip end portion Pa. The width W of the second connection region Pc2 gradually increases toward the both sides in the width direction away from the base end portion Pb. In this manner, the wide width surfaces Fw have shapes such as substantially spindle shapes or substantially oval shapes.

The body portions PC2 and PC3 become the widest at the linking position (boundary) between the first connection region Pc1 and the second connection region Pc2. The maximum value Wmax of the width W of the body portions PC2 and PC3 is set to be about a double of the diameter D, for example, or is set to be equal to or greater than 105% and equal to or less than 250% of the diameter D. The maximum value Wmax of the width W is set to be about 70 µm, for example.

In the probes Pr2 and Pr3, the shapes of the body portions PC2 and PC3, more specifically, the positions at which the thickness T of the body portions PC2 and PC3 become the minimum value Tmin and the positions at which the width W of the body portions PC2 and PC3 become the maximum value Wmax are different.

The recess of the body portion PC2 of the probe Pr2 has a curved shape along an arc, for example. The length L1 and the length L2 are equal to each other, and the thickness T becomes the minimum value Tmin and the width W becomes the maximum value Wmax at the center C of the body portion PC2. Since the stress applied to the body portion is distributed over the entire body portion PC2 with a satisfactory balance by forming the recess of the bottom portion PC2 into a curved shape along an arc, contact stability of the probe Pr2 with respect to the inspection target is improved.

The recess of the bottom portion PC2 can be formed into an arc shape with a curvature radius R of 180 mm when the length Lc of the body portion PC2 is 4.9 mm, for example. In addition, the recess of the body portion PC2 of the probe Pr2 is not limited to the example of the recess in the ark shape, and the recess may be a part of an oval, a quadratic curve, other various curved shapes, or a shape of a combination thereof, for example.

Since the thickness of the body portion PC2 smoothly changes in the curved shape over the entire body portion PC2 by forming the recess of the body portion PC2 into the curved shape even if the curved shape is not an arc shape, concentration of stress is hardly to be caused when the probe Pr2 is caused to abut on the inspection target.

The probe Pr3 is different from the probe Pr2 in that the position at which the thickness T becomes the minimum and the position at which the width W becomes the maximum are positions deviating from the central position of the body portion PC3 in the axial direction and the length L1 and the length L2 are different from each other.

The thickness T of the body portion PC3 becomes the minimum value Tmin and the width W of the body portion PC3 becomes the maximum value Wmax at the position at which L1:L2=2:1 is satisfied, for example. The recess of the body portion PC3 of the probe Pr3 has a curved shape of a combination of a plurality of arcs, for example.

For example, when the length Lc of the body portion PC3 is 4.9 mm, it is possible to form the recess of the first connection region Pc1 into an arc shape with a curvature radius R of 320 mm and to form the recess of the second connection region Pc2 into an arc shape with a curvature radius R of 80 mm. Note that the body portion PC3 is not limited to the example in which the body portion PC3 is recessed into the shape of a combination of a plurality of arcs, and for example, the recess may be a part of an oval, a quadratic curve, other various curved recesses, or a shape of a combination thereof.

Furthermore, in the front views FV illustrated in FIGS. 3 and 4, the body portions PC2 and PC3 of the probes Pr2 and Pr3 may have substantially square shapes with a constant width W in a front view.

Also, the first connection region Pc1 and the second connection region Pc2 of the probe Pr may be configured to gradually linearly become thinner from the both sides in the thickness direction away from the tip end portion Pa and the base end portion Pb or may be configured to gradually become thinner in a curved manner. Also, the first connection region Pc1 and the second connection region Pc2 are not limited to the shapes in which the thicknesses are symmetrically reduced from the opposite sides in the thickness direction, that is, the shapes that are symmetrically recessed from the opposite sides, and may have asymmetrical shapes relative to the both sides in the thickness direction. Alternatively, the first connection region Pc1 and the second connection region Pc2 may have shapes that are recessed only from one side in the thickness direction.

It is possible to adjust the bending properties of the probe Pr by appropriately setting the lengths L1 and L2 and the shapes of the first connection region Pc1 and the second connection region Pc2 (how the thickness T changes).

The width W of the first connection region Pc1 and the second connection region Pc2 of the probe Pr may be configured to gradually linearly increases from the both sides in the width direction or may be configured gradually increases in a curved manner, away from the tip end portion Pa and the base end portion Pb. Also, the first connection region Pc1 and the second connection region Pc2 are not limited to the shapes in which the width W symmetrically increases on the both sides in the width direction, that is, the shapes that symmetrically expand on the both sides and may be asymmetrical shapes on the opposite sides in the width direction. Alternatively, the first connection region Pc1 and the second connection region Pc2 may have shapes that expand only on one side in the width direction.

The first connection region Pc1 corresponds to an example of the first width region, and the second connection region Pc2 corresponds to an example of the second width region. In addition, the regions in which the width W changes are not necessarily limited to the example that the first connection region Pc1 is consistent with the second connection region Pc2, and the first connection region Pc1 and second connection region Pc2 may be different from the first width region and the second width region.

It is possible to adjust the bending properties of the probe Pr, which will be described later, by appropriately setting the lengths of the first width region and the second width region, for example, the lengths L1 and L2, and the shapes of the first width region and the second width region (how the width W changes).

Also, a slit penetrating in the thickness direction or a recessed portion may be provided at the body portion PC. It is also possible to adjust the bending properties of the probe Pr by the slit penetrating in the thickness direction or the recessed portion. In addition, the aforementioned slit or recessed portion leads to an increase in the surface area of the probe Pr and an increase in the skin effect of the current. Therefore, the probe Pr is easy to cause the current to pass therethrough. If the aforementioned slit or recessed portion is formed in the axial direction, the probe Pr is easier to cause the current to pass therethrough.

Also, the outer surfaces of the body portion PC, the tip end portion Pa, and the base end portion Pb with mutually different sizes are continuously and smoothly linked by the first connection region Pc1 and the second connection region Pc2 being provided. In a case in which the outer surfaces of the body portion PC, the tip end portion Pa, and the base end portion Pb are not continuously linked, and for example, the outer surfaces become angular, there is a concern that stress may concentrate on the non-continuous portion when the probe Pr is caused to abut on the inspection target and may damage the probe Pr. However, concentration of the stress distribution is reduced by the probe Pr being provided with the first width region and the second width region.

The lengths, the widths, and the thicknesses of the respective portions of the probe Pr are just examples and can be appropriately set.

Figure 5:
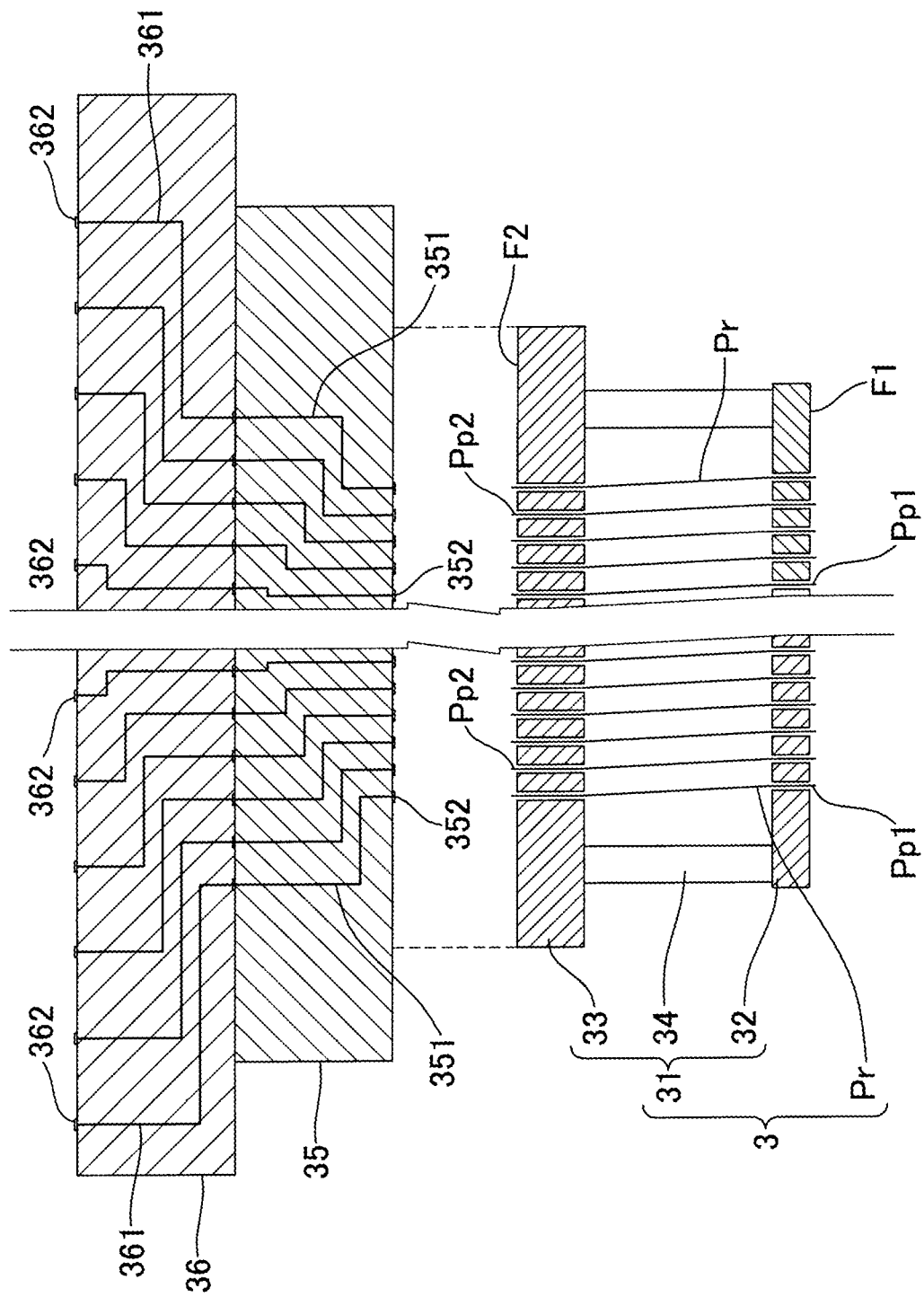
FIG. 5 is a sectional view of the inspection jig illustrated in FIG. 1, a first pitch conversion block, and a second pitch conversion block.

FIG. 5 is a cross-sectional view of the inspection jig 3 illustrated in FIG. 1, the first pitch conversion block 35, and a second pitch conversion block 36. FIG. 5 illustrates the inspection jig 3 and the first pitch conversion block 35 in a separated state. The inspection-side support body 32 has a facing surface F1 arranged to face the semiconductor wafer 100. The electrode-side support body 33 has a rear surface F2 that is brought into a close contact with a lower surface of the first pitch conversion block 35. The apex portion Pp2 of the probe Pr slightly protrudes from the rear surface F2.

Each of the first pitch conversion block 35 and the second pitch conversion block 36 has a substantially cylindrical shape that is flattened in the axial direction, for example. A plurality of electrodes 352 is formed in the lower surface of the first pitch conversion block 35 that is brought into close contact with the rear surface F2 such that the electrodes 352 correspond to the arrangement of the apex portion Pp2 of each probe Pr. A plurality of electrodes arranged at a wider interval than the plurality of electrodes 352 is formed on the upper surface of the first pitch conversion block 35. The electrodes 352 on the lower surface and the electrodes on the upper surface of the first pitch conversion block 35 are connected to each other with wires 351.

A plurality of electrodes is formed in the lower surface of the second pitch conversion block 36 such that the electrodes correspond to the arrangement of the electrodes on the upper surface of the first pitch conversion block 35. A plurality of electrodes 362 formed corresponding to the arrangement of the electrode on the aforementioned connection plate 37 is formed on the upper surface of the second pitch conversion block 36. The electrodes on the lower surface and the electrodes 362 on the upper surface of the second pitch conversion block 36 are connected to each other with wires 361.

In this manner, the inspection processing unit 8 can input and output a signal to and from each probe Pr by assembling the inspection jig 3, the first pitch conversion block 35, and the second pitch conversion block 36 and attaching the second pitch conversion block 36 to the connection plate 37.

The first pitch conversion block 35 and the second pitch conversion block 36 can be configured using multilayered wiring substrates of, for example, multi-layer organic (MLO), multi-layer ceramic (MLC), or the like.

Figure 6:
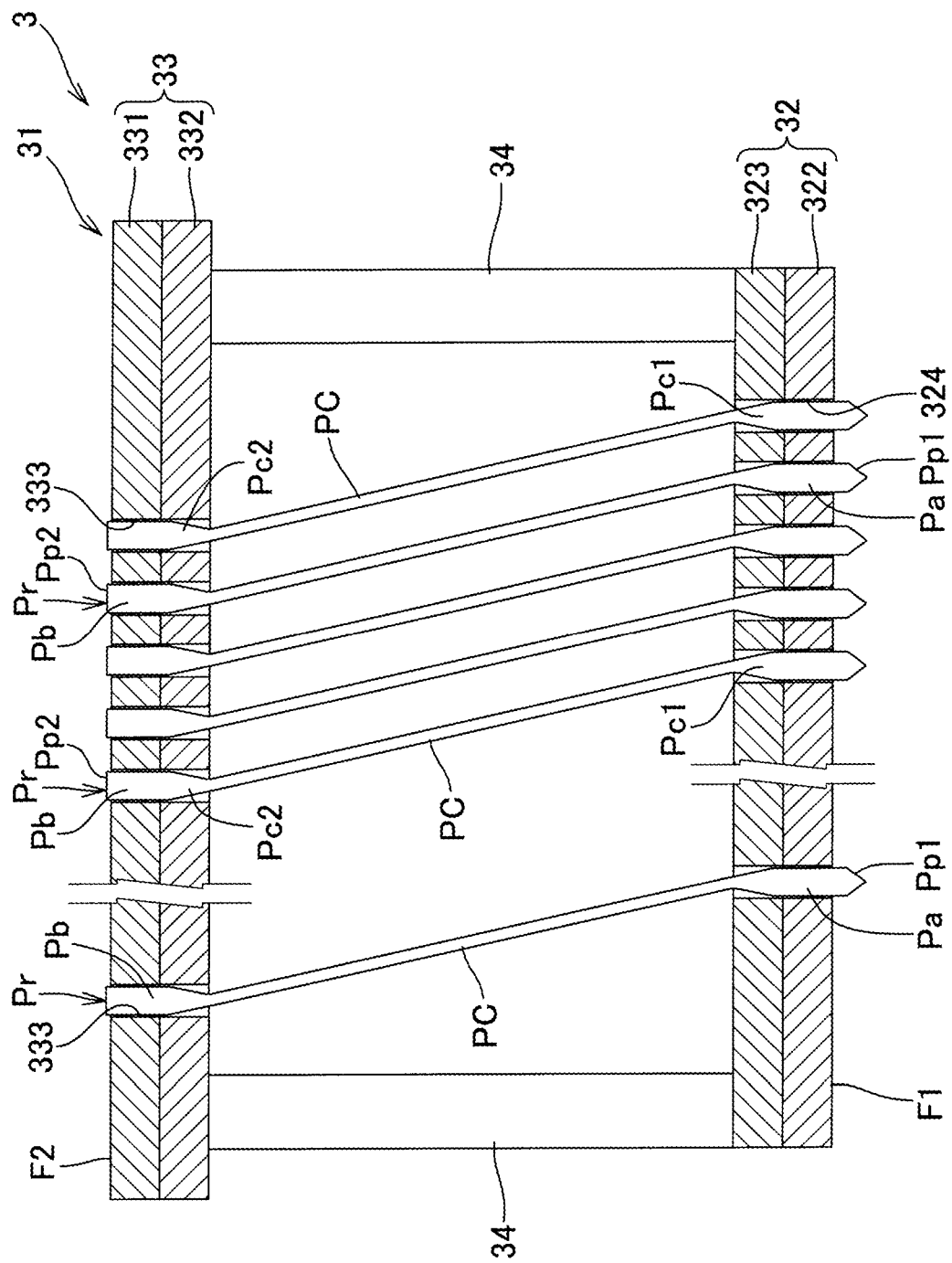
FIG. 6 is a sectional view illustrating an example of a configuration of the inspection jig illustrated in FIG. 1.

FIG. 6 is a cross-sectional view illustrating an example of a configuration of the inspection jig 3 illustrated in FIGS. 1 and 5. The inspection-side support body 32 is configured by a facing plate 322 and a guide plate 323 being laminated. The facing plate 322 has a facing surface F1 arranged to face the semiconductor wafer 100. The facing plate 322 is integrally secured to the guide plate 323 with a detachable securing means such as a bolt.

A plurality of probe insertion holes 324 (second through-holes) into which the tip ends Pa of the probes Pr are inserted is formed in the inspection-side support body 32. Each probe insertion hole 324 guides the apex portion Pp1 of each probe Pr to each of the plurality of inspection points provided on the semiconductor wafer 100. Each probe Pr is arranged such that at least a part of the first connection region Pc1 of the probe Pr is located in the probe insertion hole 324.

The electrode-side support body 33 is configured such that a support plate 331 and a spacer plate 332 are laminated in this order from the side opposite to the facing surface F1. The surface of the support plate 331 on the side opposite to the facing surface F1 is regarded as a rear surface F2. A plurality of probe support holes 333 (first through-holes) corresponding to the plurality of probe insertion holes 324 is formed in the electrode-side support body 33.

The electrode-side support body 33 corresponds to an example of the first plate, the inspection-side support body 32 corresponds to an example of the second plate, the probe support hole 333 corresponds to an example of the first through-hole, and the probe insertion hole 324 corresponds to an example of the second through-hole. Note that the electrode-side support body 33 may be regarded as the second plate, the inspection-side support body 32 may be regarded as a first plate, the probe support hole 333 may be regarded as the second through-hole, and the probe insertion hole 324 may be regarded as the first through-hole.

The base end portions Pb of the probes Pr are inserted into the probe support holes 333. The apex portions Pp2 of the base end portions Pb slightly protrudes from the rear surface F2. In this manner, the base end portions Pb of the respective probes Pr are caused to abut on the electrodes 352 of the first pitch conversion block 35 such that the base end portions Pb can be connected to the inspection processing unit 8 in a conductive manner.

Each probe Pr is arranged such that at least a part of the second connection region Pc2 of the probe Pr is located in the probe insertion hole 333.

In addition, each of the inspection-side support body 32 and the electrode-side support body 33 is not limited to the example that each of them is configured by a plurality of plates being laminated and may be configured by a single plate. Also, a configuration in which the base end portion Pb is inserted into the probe insertion hole 324 of the inspection-side support body 32 and the tip end portion Pa is inserted into the probe support hole 333 of the electrode-side support body 33 may be employed. In addition, a configuration in which the base end portion Pb is caused to abut on the inspection target and the tip end portion Pa is caused to abut on the electrode 352 of the first pitch conversion block 35 may be employed.

FIG. 6 is a cross-sectional view taken along the thickness direction of each block Pr, the left-right direction on the sheet surface corresponds to the thickness direction of each probe Pr, and the depth direction on the sheet surface corresponds to the width direction of each probe Pr. The orientation of each probe Pr is aligned such that the thickness direction (width direction) is oriented in the same direction.

The inspection-side support body 32 and the electrode-side support body 33 are arranged such that the corresponding probe insertion holes 324 and the probe support holes 333 are located at positions deviating in the thickness direction of the respective probes Pr. In this manner, the probes Pr inserted into the corresponding probe insertion holes 324 and the probe support holes 333 are held in an inclined or curved state relative to the vertical lines of the facing surface F1 and the rear surface F2 between the inspection-side support body 32 and the electrode-side support body 33.

In addition, the mutually corresponding probe insertion holes 324 and the probe support holes 333 are not necessarily limited to the example in which the probe insertion holes 324 and the probe support holes 333 are located at the positions deviating in the thickness direction of the respective probes Pr. A configuration in which the mutually corresponding probe insertion holes 324 and the probe support holes 333 are located on the vertical line of the facing surface F1 may also be employed. If the configuration in which the mutually corresponding probe insertion holes 324 and the probe support holes 333 are located on the vertical line of the facing surface F1 is employed, it is easy to insert the probes Pr into the probe insertion holes 324 and the prove support holes 333, and for example, it is easy to mechanize the operation of inserting the probes Pr.

Figure 7:
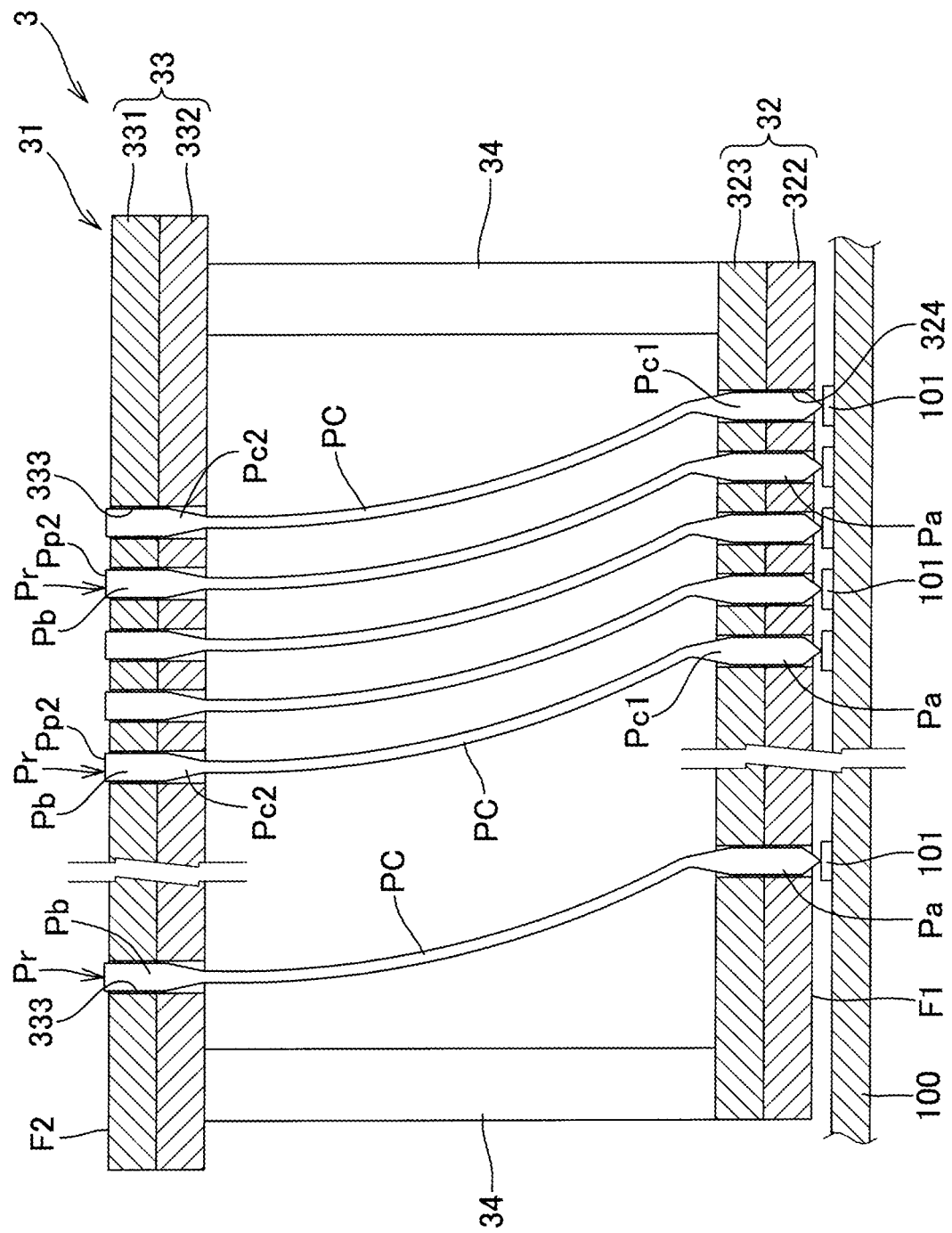
FIG. 7 is an explanatory diagram illustrating a state in which a semiconductor wafer is caused to abut on the inspection jig illustrated in FIG. 6 and an inspection point formed on the surface of the semiconductor wafer is in contact with a tip end of each probe.

FIG. 7 illustrates a state in which the semiconductor wafer 100 is caused to abut on the inspection-side support body 32 of the inspection jig 3 illustrated in FIG. 6 and the inspection points 101 formed on the surface of the semiconductor wafer 100 are in contact with the tip end portions Pa of the respective probes Pr. As illustrated in FIG. 7, if the inspection points 101 is pressed against the tip end portions Pa and the protruding portions of the tip end portions Pa are pressed into the probe insertion holes 324. The body portions PC of the respective probes Pr are bent.

As illustrated in FIG. 6, since the respective probes Pr are held in an inclined or curved state relative to the vertical lines of the facing surface F1 and the rear surface F2, the body portions PC are smoothly bent due to a pressing force when the apex portions Pp1 protruding from the facing surface F1 are caused to abut on and are pressed against the inspection points. The probes Pr causes spring properties by being bent. As a result, it is possible to cause the apex portions Pp1 to be elastically in contact with the inspection points due to elastic force of the body portion PC and thereby to improve contact stability.

Figure 8:
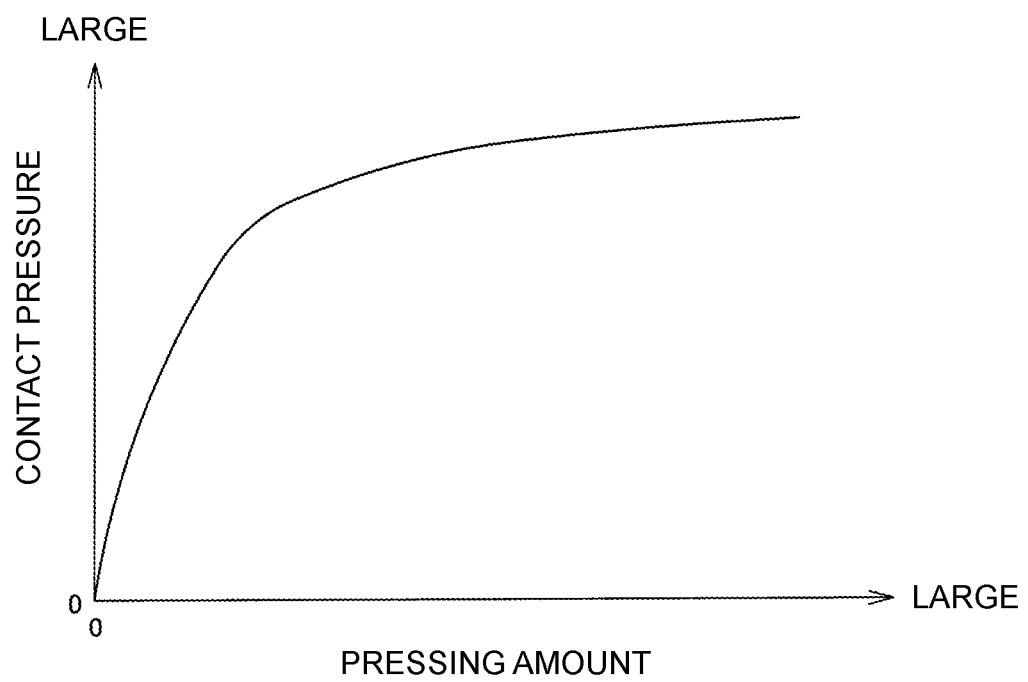
FIG. 8 is a graph illustrating an example of a relationship between an amount of pressing of the probe and a contact pressure of the probe with respect to the inspection point.

FIG. 8 is a graph illustrating an example of a relationship between an amount of pressing the probe Pr and a contact pressure of the probe Pr with respect to the inspection point. The horizontal axis represents the pressing amount by which the probe Pr is pressed in the axial direction, and the vertical axis represents the contact pressure of the probe Pr with respect to the inspection point.

As for the contact pressure of the probe Pr, a high pressure may be obtained at a moment at which the probe Pr is brought into contact with the inspection point in order to remove an oxide film or the like on the surface of the inspection point. Also, the contact pressure may not change, and the probe Pr may be stably in contact when inspection is performed after the probe Pr is brought into contact with the inspection point. The contact pressure properties of the probe Pr illustrated in FIG. 8 changes in accordance with how the probe Pr is bent, that is, in accordance with the aforementioned bending properties. Therefore, it is possible to adjust the bending properties by adjusting the shape of the probe Pr as described above and to obtain desired contact pressure properties.

Figure 9:
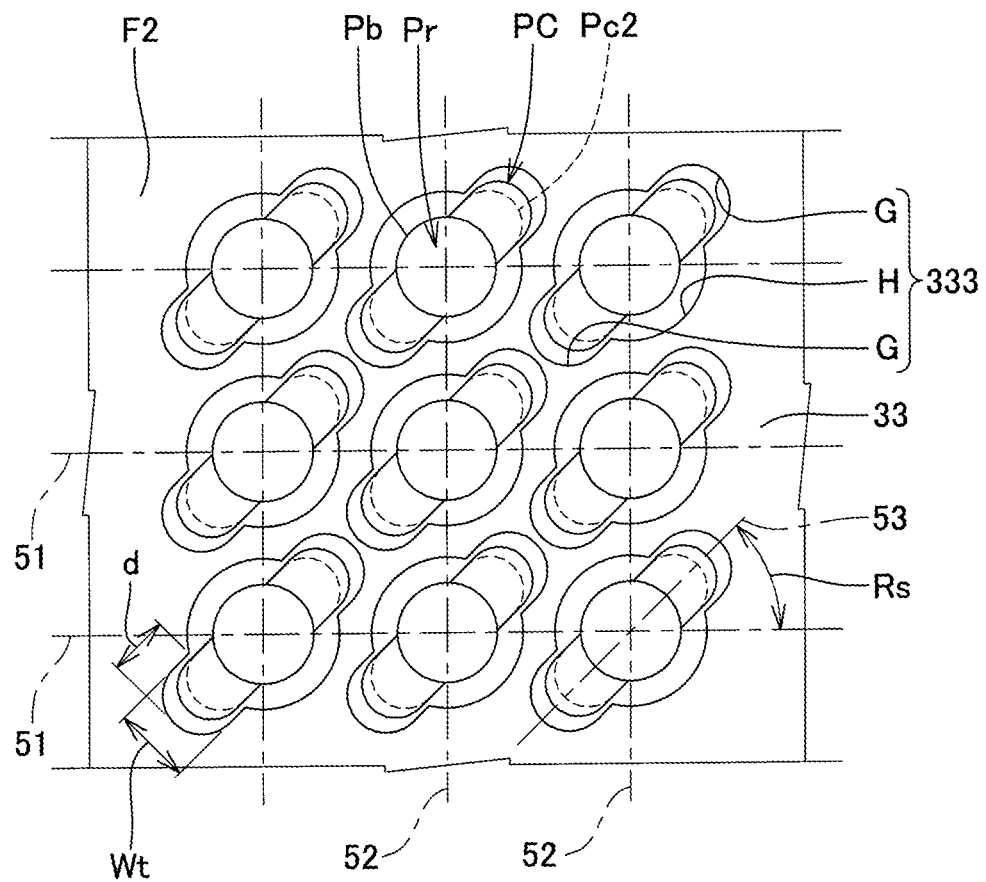
FIG. 9 is a plan view of the inspection jig illustrated in FIG. 6 when seen from the rear surface side.
Figure 10:
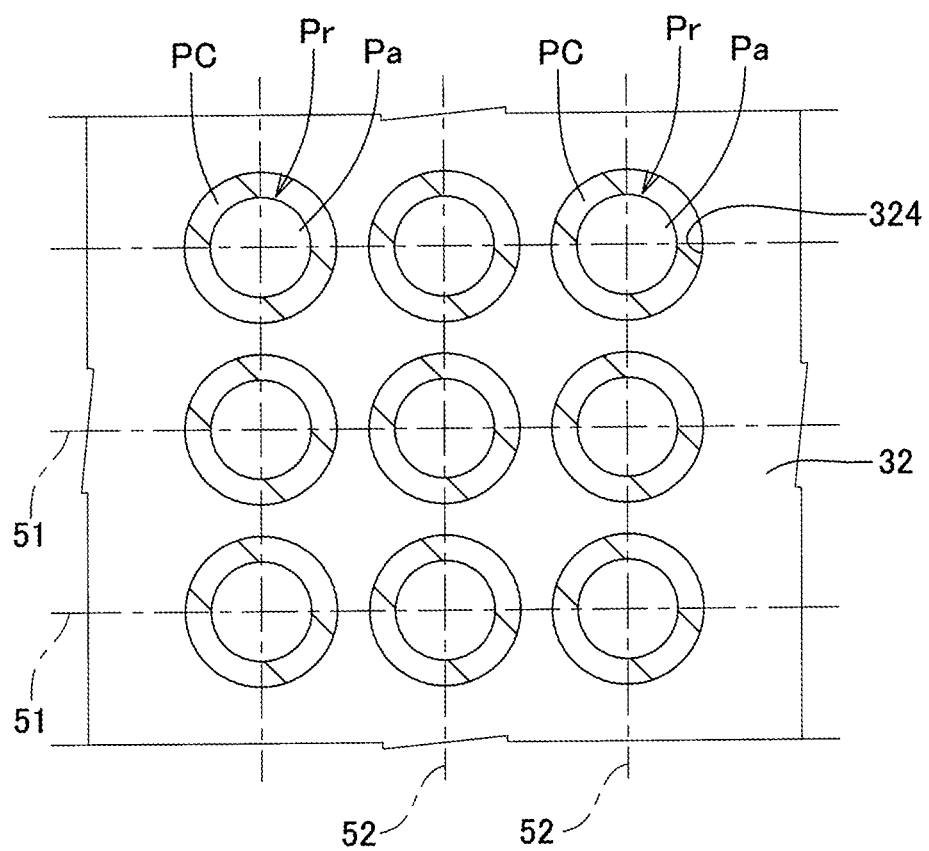
FIG. 10 is a plan view of the inspection jig illustrated in FIG. 6 when seen from the facing surface side.

FIG. 9 is a plan view of the inspection jig 3 illustrated in FIG. 6 when seen from the rear surface F2 side. FIG. 9 illustrates a state in which a part of the electrode-side support body 33 is partially cut. FIG. 10 is a plan view of the inspection jig 3 illustrated in FIG. 6 when seen from the facing surface F1 side. FIG. 10 illustrates a state in which a part of the inspection-side support body 32 is partially cut.

The probe support hole 333 illustrated in FIG. 9 includes a hole main body H with a substantially circular shape and a pair of guide grooves G that are formed at mutually facing positions in an inner wall of the hole main body H such that the guide grooves G extend in the penetrating direction. The inner diameter of the hole main body H is adapted to be larger than the diameter D and such that the tip end portion Pa and the base end portion Pb can be inserted. Also, the inner diameter of the hole main body H is adapted to be smaller than the maximum width W at the portion of the body portion PC that is located in the probe support hole 333.

FIG. 9 illustrates a portion with the maximum width W of the portion of the body portion PC that is located in the probe support hole 333 using a dashed line. The pair of guide grooves G have a width Wt and a depth d of the grooves into which the portion with the maximum width W of the body portion PC can be inserted in a plan view when the probe Pr is seen in the axial direction.

Since the probe Pr can be inserted into the probe support hole 333 from the side of the rear surface F2 of the support member 31 by the pair of guide grooves G being configured such that the portion with the maximum width W of the body portion PC can be inserted, it becomes easy to assemble the inspection jig 3.

The probe insertion hole 324 illustrated in FIG. 10 is a through-hole with a substantially circular shape, and the guide grooves G are not formed therein. The inner diameter of the probe insertion hole 324 is adapted to be larger than the diameter D and such that the tip end portion Pa is located in the probe insertion hole 324.

Meanwhile, the width direction of the plate-shaped regions of the needle tip portion and the needle rear portion have an angle of about 90 degrees relative to the width direction of the plate-shaped region of the needle intermediate portion in the probe disclosed in Patent Document 1. Also, since the probe unit disclosed in Patent Document 1 has a structure of holding the probe by inserting the plate-shaped regions of the needle tip portion and the needle rear portion of the probe into a slit of a base plate, it is not possible to insert the needle intermediate portion into the slit of the base plate. Meanwhile, since the inspection jig 3 can attach the probe Pr to the support member 31 by inserting the probe Pr from the probe support hole 333, it is easier to perform the assembly than the probe unit disclosed in Patent Document 1.

Also, at least a part of the portion of the body portion PC of the probe Pr at the portion projecting outwardly from the outer periphery of the base end portion Pb is located in the pair of guide grooves G of the probe support hole 333. In this manner, the width direction of the probe Pr inserted into the probe support hole 333 is aligned in the facing direction 53 in the pair of guide grooves G of the probe support hole 333 face each other.

The centers of the plurality of probe support holes 333 and the probe insertion holes 324 are arranged at the respective intersecting points between the plurality of first straight lines 51 that are parallel to each other and the plurality of second straight lines 52 that are parallel to each other intersect in a grid pattern. The facing direction 53 in which the pair of guide grooves G in each probe support hole 333 face each other is the same direction and is inclined relative to the first straight lines 51 and the second straight lines 52.

In this manner, it is possible to reduce the adjacent pitches of the probe support holes 333 and the probe insertion holes 324 as compared with a case in which the facing direction 53 is set to be a direction along the first straight lines 51 or the second straight lines 52. Since the pair of guide grooves G are provided in a hole directions, in which the adjacent pitches are large, which are adjacent to a diagonal direction of the grid, in a case in which an inclination angle Rs of the facing direction 53 with respect to the first straight lines 51 and the second straight lines 52 in a case in which the grid pattern is a regular square shape is set to be 45 degrees, in particular, it is possible to minimize the adjacent pitches of the probe support holes 333 and the probe insertion holes 324.

Also, since the direction 53 in which the pair of guide grooves G in the respective probe support holes 333 face each other is aligned in the same direction, the width direction of the respective probes Pr is also aligned in the same direction. Thus, since the probes Pr tends to be bent in the thickness direction of the body portions PC, that is, in the direction that perpendicularly intersects the facing direction 53 as described above, the width direction of the respective probes Pr is aligned in the same direction, and as a result, the bending direction of the respective proves Pr is also aligned in the same direction. As a result, the concern that the adjacent probes Pr are bent in the opposite directions and are brought into contact with each other is reduced.

In addition, although the example in which the guide grooves G are formed only in the probe support holes 333 has been described above, the guide grooves G may be formed in both the probe support holes 333 and the probe insertion holes 324, or the guide grooves G may be formed only in the probe insertion holes 324. It is possible to insert the probes Pr from the side of the probe insertion holes 324 and to attach the probes Pr to the support member 31 by forming the guide grooves G in the probe insertion holes 324. In addition, it is also possible to align the width direction of the respective probes Pr in the same direction using the guide grooves G in the probe insertion holes 324 similarly to the guide grooves G in the probe support holes 333.

Also, it is only necessary for the pair of guide grooves G to have the width Wt and the depth d with which it is possible to accommodate at least a portion of the body portions PC located in the probe support holes 333 and/or the probe insertion holes 324, and it is not necessary to insert the portions with the maximum width W of the body portions PC. In this case, it is also possible to assembly the inspection jig 3 by the method of inserting the probes Pr into the probe support holes 333 and the probe insertion holes 324 in a state in which the inspection-side support body 32 or the electrode-side support body 33 is detached from the coupling member 34.

Figure 11:
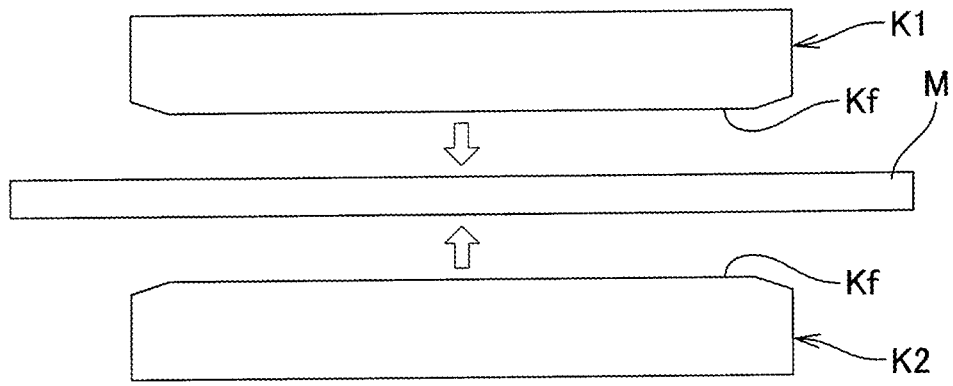
FIG. 11 is an explanatory diagram for explaining an example of a method of manufacturing the probe illustrated in FIG. 2.

FIG. 11 is an explanatory diagram for explaining an example of a method of manufacturing the probe Pr1 illustrated in FIG. 2. The probe Pr1 can be manufactured by pinching a round bar-like member M of a conductive metal material or the like between a pair of a first mold K1 and a second mold K2 with press surfaces Kf projecting in a trapezoidal shape, for example, corresponding to the shape of the body portion PC1, for example, and performing press-working thereon.

Figure 12:
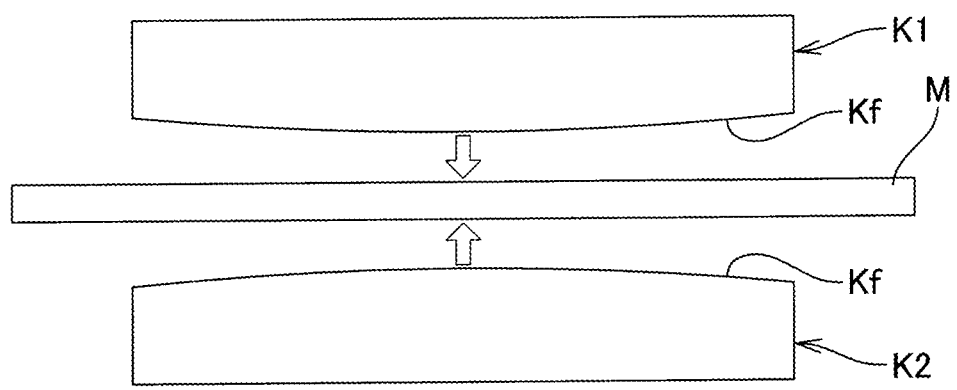
FIG. 12 is an explanatory diagram for explaining an example of a method of manufacturing the probe illustrated in FIG. 3.

FIG. 12 is an explanatory diagram for explaining an example of a method of manufacturing the probe Pr2 illustrated in FIG. 3. For example, the probe Pr2 can be manufactured by pinching a bar-like member M between the pair of the first mold K1 and the second mold K2 with press surfaces Kf projecting in an arc shape, for example, corresponding to the shape of the body portion PC2, for example, and performing press-working thereon.

Figure 13:
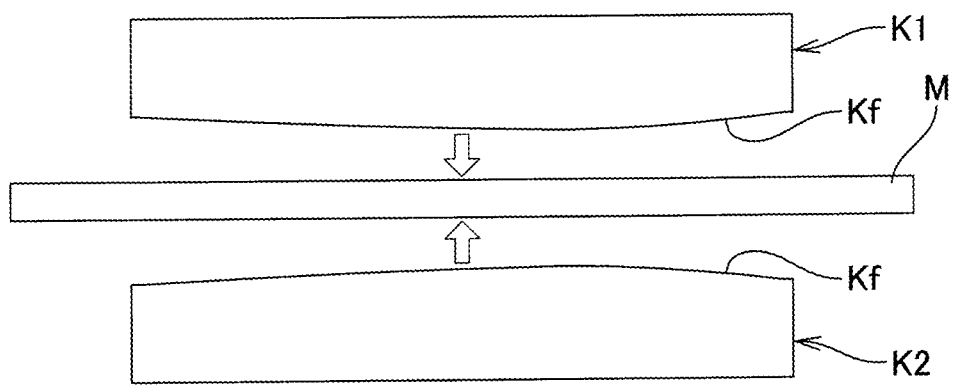
FIG. 13 is an explanatory diagram for explaining an example of a method of manufacturing the probe illustrated in FIG. 4.

FIG. 13 is an explanatory diagram for explaining an example of a method of manufacturing the probe Pr3 illustrated in FIG. 4. The probe Pr3 can be manufactured by pinching a bar-like member M between the pair of the first mold K1 and the second mold K2 with press surfaces Kf projecting, for example, in a shape of a combination of two arcs with different curvature radii, for example, corresponding to the shape of the body portion PC3, for example, and performing press-working thereon.

In the manufacturing method illustrated in FIGS. 11 to 13, the pressing is not limited to the example in which it is performed once, and the probes Pr1, Pr2, and Pr3 may be molded while the width W of the body portions PC are gradually expanded by performing pressing a plurality of times while sequentially reducing the interval between the first mold K1 and the second mold K2, for example. In this case, it is possible to reduce the amount of deformation of the bar-like member M in each pressing and thereby to reduce distortion applied to the probes Pr1, Pr2, and Pr3.

Also, shapes of a plurality of probes Pr may be molded by aligning and integrating a plurality of first molds K1 illustrated in FIGS. 11 to 13, for example, at such intervals that slightly exceed the total length of the tip end portions Pa and the base end portions Pb in the axial direction of the round bar-like member M, similarly aligning and integrating a plurality of second molds K2 at such intervals that slightly exceed the total length of the tip end portions Pa and the base end portions Pb in the axial direction of the round bar-like member M, and performing press-working with the mold in which the plurality of first molds K1 are integrated and with the mold in which the plurality of second molds K2 are integrated. Then, the plurality of probes Pr may be manufactured by cutting the individual probes Pr after such press-working.

The probes Pr can be manufactured merely by press-working the round-bar wire material from one direction (both sides) using one type of first mold K1 and second mold K2 as illustrated in FIGS. 11 to 13. Therefore, the probes can more easily be manufactured than the probe as disclosed in Patent Document 1 that requires press-working at least twice while the molds and the press direction are changed.

Note that the shapes of the body portions PC may be adjusted through cutting or the like of the opposite sides or one side of the body portions PC when seen from the front in the front view FV illustrated in FIGS. 2 to 4 after the press-working illustrated in FIGS. 11 to 13.

The inspection processing unit 8 illustrated in FIG. 1 can be configured using, for example, a signal generation circuit, a signal detection circuit, a power source circuit, a voltmeter, an ammeter, a microcomputer, and the like. The inspection processing unit 8 outputs an inspection signal to the inspection points 101 of the semiconductor wafer 100 via the probes Pr and detects a signal occurring in the semiconductor wafer 100 via the probes Pr. Then, a reference signal pattern stored in advance is compared with the detected signal, for example, thereby inspecting the semiconductor wafer 100.

Alternatively, the inspection processing unit 8 supplies a current between two inspection points of a measurement target via the probes Pr and measures a voltage between the two inspection points in a case in which a substrate is an inspection target, for example. A resistance value between the two inspection points is calculated by an Ohm's law based on the supplied current and the measured voltage. The inspection processing unit 8 can execute the inspection of the substrate by detecting the resistance value between the respective inspection points in this manner.

Note that the inspection processing unit 8 can inspect the inspection target by various methods, and the inspection methods are not limited.

Other Configurations

According to one aspect of one embodiment of the disclosure, a probe is provided to have a substantially bar-like shape that extends linearly. The probe includes one end portion, a body portion that is continuous with the one end portion; and an other end portion that continues from the body portion. The body portion includes a first connection region having a thickness in a thickness direction perpendicular to an axial direction of the bar-like shape that gradually decreases away from the one end portion, and a second connection region having a thickness that gradually decreases away from the other end portion. A dimension of the body portion in a width direction perpendicular to the thickness direction is larger than dimensions of the one end portion and the other end portion.

According to this configuration, since it is possible to manufacture the probe by press working a part of the substantially bar-like member such that it becomes thin and is widen in the width direction and forms the body portion, it is easy to manufacture the probe. Also, since the thickness of the body portion is smaller than the width dimension, the body portion is easy to be bent in the thickness direction, and as a result, it becomes possible to control the bending direction. Also, the outer surfaces of the body portion, the one end portion, and the other end portion with mutually different sizes are continuously and smoothly linked due to providing the first connection region and the second connection region. In a case in which the outer surfaces of the body portion, the one end portion, and the other end portion are not continuously linked, and for example, the outer surfaces become angular, there is a concern that stress may be concentrated on the non-continuous portion when the probe is caused to abut on the inspection target and the probe may be damaged. However, concentration of the stress distribution is reduced by the probe being provided with the first width region and the second width region.

In one embodiment, the body portion may include a flat region having a substantially constant thickness and extending between the first connection region and the second connection region.

According to the configuration, it is easy to apply a desired strength to the probe by appropriately setting the thickness of the flat region.

In one embodiment, a dimension of the flat region in the width direction may be substantially constant.

According to the configuration, it is easy to apply a desired strength to the probe by appropriately setting the width dimension of the flat region to be substantially constant.

In one embodiment, a change in the thickness of at least one of the first connection region and the second connection region may be a curved shape.

According to the configuration, since the thickness of at least one of the first connection region and the second connection region smoothly changes in a curved shape, concentration of stress does not tend to occur when the probe is caused to abut on the inspection target.

In one embodiment, a change in the thickness of at least one of the first connection region and the second connection region may be a curved shape along an arc.

According to the configuration, since the stress applied to at least one of the first connection region and the second connection region is distributed with satisfactory balance, contact stability of the probe with respect to the inspection target is improved.

In one embodiment, a thickness of the body portion may be thinnest at the center of the body portion in the axial direction.

According to the configuration, it is easy to form the body portion to have a substantially symmetric shape on the opposite sides when seen from the center in the axial direction. As a result, since it becomes easy to distribute the stress applied to the body portion with satisfactory balance, contact stability of the probe with respect to the inspection target is improved.

In one embodiment, a thickness of the body portion in the thickness direction may be thinnest at a position deviating from the center of the body portion in the axial direction.

According to the configuration, it is possible to adjust the bending properties of the probe by appropriately setting where the thinnest portion of the body portion is to be disposed and the manner of deviation of the portion.

In one embodiment, the body portion may include a first width region having a dimension in the width direction that gradually increases away from the one end portion, and a second width region having a dimension in the width direction that gradually increases away from the other end portion.

According to the configuration, since the width of the body portion is larger than those of the one end portion and the other end portion, it is possible to apply a strength to the body portion depending on the width while controlling the bending direction.

In addition, according to another aspect of the disclosure, an inspection jig is provided to include: the aforementioned probe; a first plate that has a first through-hole into which the probe is inserted formed therein; a second plate that has a second through-hole into which the probe is inserted formed therein; and a linking member that supports the first plate and the second plate with an interval therebetween. At least a part of the body portion is located in the first through-hole. The first through-hole includes a hole main body, which has an inner diameter smaller than a maximum dimension of a portion located in the first through-hole of the body portion in the width direction, and through which the one end portion is able to be inserted. A pair of guide grooves that are formed at positions that face one another in an inner wall of the hole main body such that the guide grooves extend in a penetrating direction of the first through-hole. At least a part of the body portion is located in the pair of guide grooves.

According to the configuration, since at least a part of the body portion is located in the pair of guide grooves in a state in which the probe is inserted into the first through-hole and the second through-hole, a wide width portion of the body portion is fitted into the guide grooves, and the width direction of the body portion is oriented along the direction in which the pair of guide grooves face each other. Since the body portion is easy to be bent in the thickness direction, it is possible to define the bending direction of the body portion, that is, the bending direction of the probe if the orientation of the body portion in the width direction can be defined.

In one embodiment, the portion with the maximum dimension of the body portion in the width direction may be able to be inserted into the pair of guide grooves.

According to the configuration, since it is possible to assemble the inspection jig by inserting the probe from the first through-hole in a state that the first plate, the second plate, and the linking member are assembled, it is easy to assemble the inspection jig.

In one embodiment, the inspection jig may include a plurality of probes. A plurality of first through-holes corresponding to the plurality of probes may be formed in the first plate, and a plurality of second through-holes corresponding to the plurality of first through-holes may be formed in the second plate. In addition, facing directions of each of pairs of the guide grooves formed in the plurality of the first through-holes are substantially the same.

According to the configuration, the width direction of the plurality of probes is oriented in the same direction in the direction in which each pair of guide grooves face each other. As a result, it is possible to align the bending direction of the plurality of probes in the same direction.

In one embodiment, the plurality of first through-holes may be arranged at the respective intersection points at which a plurality of first straight lines that are parallel to each other and a plurality of second straight lines that are parallel to each other intersect one another in a grid pattern. The respective facing directions may be inclined relative to the first straight lines and the second straight lines.

According to the configuration, the interval between probes that are adjacent in the direction along the first straight lines or the second straight lines becomes narrowest. Thus, since the width direction of each probe is oriented in a direction in which an interval between adjacent probes becomes wider due to the direction in which each pair of guide grooves face each other, that is, the width direction of each probe being inclined relative to the first straight line and the second straight line, it is possible to further reduce the interval between respective adjacent probes.

According to still another aspect of the disclosure, an inspection device is provided to allow inspection of an inspection target by causing the aforementioned probe to abut on the inspection target.

According to the configuration, it becomes easy to manufacture the probe that is used in the inspection device, and as a result, it becomes easy to manufacture the inspection device.

According to still another aspect of the disclosure, a method of manufacturing the probe above is provided and the method includes: using a first mold and a second mold that face one another in the thickness direction of the body portion and have protruding shapes corresponding to surface shapes recessed from both sides of the body portion; and press-working a bar-like member that is put between a first mold and a second mold.

According to the method, since it is possible to manufacture the probe through the press working using one type of first mold and one type of second mold, it is easy to manufacture the aforementioned probe.

In one embodiment, in the press working the probe may be formed by executing pressing for plural times while sequentially reducing an interval between the first mold and the second mold.

According to the method, it is possible to reduce the amount of deformation of the bar-like member in pressing performed once and thereby to reduce distortion applied to the bar-like member.

The bending direction can be controlled in a probe with such a configuration, and it is easy to manufacture the probe. Also, the inspection jig and the inspection device with such a configuration can utilize the probe in which the bending direction can be controlled and that can be easily manufactured. In addition, such a manufacturing method facilitates manufacturing of the probe in which the bending direction can be controlled.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A probe, having a substantially bar-like shape that linearly extends, the probe comprising:
   one end portion extending linearly in an axial direction of the probe;
   a body portion that is continuous with the one end portion, and extending linearly in the axial direction; and
   an other end portion that is continuous with the body portion, and extending linearly in the axial direction,
   wherein the body portion comprises:
   a first connection region, connecting the body portion with the one end portion, and having a thickness in a thickness direction perpendicular to the axial direction of the probe that gradually gets thinner from the one end portion towards the other end portion, and
   a second connection region, connecting the body portion with the other end portion, and having a thickness in the thickness direction that gradually gets thinner from the other end portion towards the one end portion, and
   a dimension of the body portion in a width direction perpendicular to the thickness direction is larger than dimensions of the one end portion and the other end portion,
   wherein the one end portion, the other end portion and the body portion extend linearly on an axial line of the probe, and the axial line is an imaginary line in the axial direction connecting the one end portion and the other end portion.

2. The probe according to claim 1, wherein the body portion further comprises a flat region, having a substantially constant thickness and extending between the first connection region and the second connection region.

3. The probe according to claim 2, wherein a dimension of the flat region in the width direction is substantially constant.

4. The probe according to claim 1, wherein a change in the thickness of at least one of the first connection region and the second connection region is a curved shape.

5. The probe according to of claim 1, wherein a change in the thickness of at least one of the first connection region and the second connection region is a curved shape along an arc.

6. The probe according to claim 1, wherein a thickness of the body portion being the thinnest is at a center of the body portion in the axial direction.

7. The probe according to claim 1, wherein a thickness of the body portion in the thickness direction being the thinnest is at a position deviating from a center of the body portion in the axial direction.

8. The probe according to claim 1, wherein the body portion comprises:
   a first width region having a dimension in the width direction that gradually increases away from the one end portion; and
   a second width region having a dimension in the width direction that gradually increases away from the other end portion.

9. An inspection jig, comprising:
   a probe, having a substantially bar-like shape that linearly extends, the probe comprising:
   one end portion;
   a body portion that is continuous with the one end portion; and
   an other end portion that is continuous with the body portion,
   wherein the body portion comprises:
   a first connection region, having a thickness in a thickness direction perpendicular to an axial direction of the bar-like shape that gradually gets thinner away from the one end portion, and
   a second connection region, having a thickness that gradually gets thinner away from the other end portion, and
   a dimension of the body portion in a width direction perpendicular to the thickness direction is larger than dimensions of the one end portion and the other end portion;
   a first plate that has a first through-hole into which the probe is inserted formed therein;
   a second plate that has a second through-hole into which the probe is inserted formed therein; and
   a linking member that supports the first plate and the second plate at an interval,
   wherein at least a part of the body portion is located in the first through-hole,
   the first through-hole comprises:
   a hole main body, which has an inner diameter smaller than a maximum dimension of a portion located in the first through-hole of the body portion in the width direction, and through which the one end portion is able to be inserted, and
   a pair of guide grooves that are formed at positions that face one another in an inner wall of the hole main body such that the guide grooves extend in a penetrating direction of the first through-hole, and
   at least a part of the body portion is located in the pair of the guide grooves.

10. The inspection jig according to claim 9, wherein the portion with the maximum dimension of the body portion in the width direction is able to be inserted into the pair of the guide grooves.

11. The inspection jig according to claim 9, comprising:
    a plurality of the probes,
    wherein a plurality of the first through-holes corresponding to the plurality of the probes are formed in the first plate,
    a plurality of the second through-holes corresponding to the plurality of the first through-holes are formed in the second plate, and
    facing directions of each of pairs of the guide grooves foinied in the plurality of the first through-holes are substantially the same.

12. The inspection jig according to claim 11,
    wherein the plurality of the first through-holes are arranged at respective intersection points at which a plurality of first straight lines that are parallel to each other and a plurality of second straight lines that are parallel to each other intersect one another in a grid pattern, and
    the respective facing directions are inclined relative to the first straight lines and the second straight lines.

13. The inspection jig according to claim 9, wherein the body portion further comprises a flat region, having a substantially constant thickness and extending between the first connection region and the second connection region.

14. The inspection jig according to claim 13, wherein a dimension of the flat region in the width direction is substantially constant.

15. The inspection jig according to claim 9, wherein a change in the thickness of at least one of the first connection region and the second connection region is a curved shape.

16. The inspection jig according to claim 9, wherein a thickness of the body portion being the thinnest is at a center of the body portion in the axial direction, or at a position deviating from a center of the body portion in the axial direction.

17. The inspection jig according to claim 9, wherein the body portion comprises:
- a first width region having a dimension in the width direction that gradually increases away from the one end portion; and
- a second width region having a dimension in the width direction that gradually increases away from the other end portion.

18. An inspection device that inspects an inspection target, the inspection device comprising:
- the inspection jig according to claim 9;
- wherein the inspection device inspects the inspection target by causing the probe to abut on the inspection target.

19. A method of manufacturing a probe, having a substantially bar-like shape that linearly extends, the probe comprising:
- one end portion;
- a body portion that is continuous with the one end portion; and
- an other end portion that is continuous with the body portion, wherein the body portion comprises:
- a first connection region, having a thickness in a thickness direction perpendicular to an axial direction of the bar-like shape that gradually gets thinner away from the one end portion, and
- a second connection region, having a thickness that gradually gets thinner away from the other end portion, and
- a dimension of the body portion in a width direction perpendicular to the thickness direction is larger than dimensions of the one end portion and the other end portion, the method comprising:
- using a first mold and a second mold that face one another in the thickness direction of the body portion and have protruding shapes corresponding to surface shapes recessed from both sides of the body portion; and
- press-working a bar-like member that is put between a first mold and a second mold.

20. The method of manufacturing the probe according to claim 19, wherein in the press working, the probe is formed by executing pressing for plural times while sequentially reducing an interval between the first mold and the second mold.

* * * * *